United States Patent [19]

Tobias

[11] 4,069,791

[45] Jan. 24, 1978

[54] AUTOMATIC TONING DEVICE

[75] Inventor: Herbert Albert Tobias, East Brunswick, N.J.

[73] Assignee: E. I. Du Pont de Nemours and Company, Wilmington, Del.

[21] Appl. No.: 728,735

[22] Filed: Oct. 1, 1976

[51] Int. Cl.² .................................... B05C 11/02
[52] U.S. Cl. ......................... 118/120; 222/200; 118/413
[58] Field of Search ............... 118/656, 653, 413, 308, 118/415, 310, 120, 311, 109; 355/3 DD; 101/DIG. 13; 427/202, 204, 205, 206, 32, 35, 27; 222/200

[56] References Cited

U.S. PATENT DOCUMENTS

| | | | |
|---|---|---|---|
| 1,179,858 | 4/1916 | Menier | 222/200 X |
| 2,319,177 | 5/1943 | Wright | 222/200 |
| 2,513,434 | 7/1950 | Tinsley | 118/308 |
| 2,748,018 | 5/1956 | Miller | 427/32 X |
| 3,104,184 | 9/1963 | Wengenroth | 427/202 X |
| 3,124,482 | 3/1964 | Olden | 118/653 |
| 3,320,879 | 5/1967 | Edwards et al. | 101/DIG. 13 |
| 3,379,175 | 4/1968 | Spencer | 427/27 X |
| 3,399,070 | 8/1968 | Scharf | 427/205 |
| 3,593,641 | 7/1971 | Adams et al. | 118/120 |
| 3,608,464 | 9/1971 | Harrell | 118/120 |
| 3,980,047 | 9/1976 | Cohen et al. | 118/109 X |

Primary Examiner—Ronald Feldbaum

[57] ABSTRACT

Apparatus is described for applying particulate material to an image-wise tacky surface. The particulate material or toner is dispensed from a hopper having a side wall vibrating laterally of the direction of movement of the surface. The tacky surface is then moved under an applicator which has a brush pad oscillating laterally of the direction of movement of the surface to embed the particulate material in the surface. Finally, the tacky surface is passed under a cleaner which has an agitating surface oscillating laterally of the direction of movement of the surface. A perforated plate is placed under both the cleaner and the applicator to aid in removing excess toner therefrom following use.

20 Claims, 3 Drawing Figures

AUTOMATIC TONING DEVICE

BACKGROUND OF THE INVENTION

This invention relates to an apparatus for applying a particulate material to a tacky surface and, more particularly, to an apparatus for automatically developing an image defined by a tacky surface using particulate materials.

DESCRIPTION OF THE PRIOR ART

A number of devices have been developed to apply particulate material, usually called toner, on an imagewise exposed surface as a result of the wide commercial acceptance of electrophotography. Thus a variety of devices and techniques such as sprinkling or dusting, cascading, transferring, brushing, etc., are well known for applying electroscopic powders.

In the graphic arts photosensitive tacky surfaced elements are used to define images and particularly, multicolor images. A photosensitive element is first given an imagewise exposure resulting in the element exhibiting different degrees of tackiness in the exposed and unexposed areas. Following the imagewise exposure, the latent image is developed by the application of toner particles on the surface and the subsequent removal of the excess particles from the non-image areas by brushing away loose toner.

A mechanical device for developing such images is described in U.S. Pat. No. 3,754,912, issued to Jones et al. Using the Jones et al. device, particles are mechanically embedded in an imaged surface using a rotating and oscillating cylindrical brush or pad. Excess powder remaining on the surface is removed as by wiping with a clean pad or brush, by vacuuming, by vibrating, by air doctoring, or by air jet.

Related methods and apparatus for developing latent electrostatic images, are described in U.S. Pat. Nos. 3,670,701 and 3,767,446 issued to Ernest W. Weiler. As described by Weiler, a toner cloud generator conveys developer to an image-bearing surface on a drum. The developer is then subjected to an oscillating pad which affixes the toner to the surface and redistributes toner from the nonimage background areas to the image. Both the pad and the cloud generator oscillate parallel to the drum axis. These devices, having application to electrostatic images, utilize a drum which requires bending or flexing of the image bearing surface. This bending can cause problems in many applications particularly those where tacky surfaces are used.

Another U.S. Pat. No. 3,265,522 issued to Abraham Games discloses a method and apparatus for developing latent images in which a doctoring blade is vibrated to maintain the powder in a mobile condition and aids in its transfer to the image bearing surface.

Still another U.S. Pat. No. 3,124,482 issued to Roger G. Olden discloses an apparatus, for developing an electrostatic image, having a vibrating hopper which simply dusts developer onto a moving web containing an electrostatic image.

All of these prior art devices have various deficiencies. For one, the application is often not uniform. It is difficult to clean and remove excess powder from the applicating and cleaning elements, hence the images become uneven and smudgy.

SUMMARY OF THE INVENTION

Accordingly it is an object of this invention to obviate many of the disadvantages of the prior art apparatus for applying particulate materials to tacky surfaces.

Another object of this invention is to provide an improved apparatus for applying particulate material to an imagewise exposed tacky surface such that the developed surface is free of streaks, has a uniform density and is conservative of particulate material.

This invention finds embodiment in an apparatus for uniformly developing an image defining surface with particulate material adherent to said surface, said apparatus having a dispenser for dispensing particulate material above the surface, an applicator for embedding particulate material in the surface, a cleaner for removing excess particulate matter from the surface, and means for moving the tacky surface in a first path or sense past the dispenser, applicator, and cleaner.

The invention is an improvement in such apparatus wherein the dispenser includes a hopper having a side wall which is independently movable and first means to oscillate the side wall laterally of said first sense for supplying the particulate material to the surface at a uniform, controlled rate.

In a particularly preferred embodiment, the cover is provided with elongated members extending downwardly into the hopper, which are oscillated laterally of the first sense, thereby to agitate the particulate material out of phase with the side wall. Further the applicator may be provided with a horizontally disposed agitating surface and means for oscillating the surface laterally of the first sense. Finally, the cleaner also is provided with an agitating surface and means are provided for oscillating that surface laterally of the first sense. The frequency of oscillation of the various elements may be the same but preferably is different. A perforated surface is provided for supporting the tacky surface and to aid in cleaning the applicator and the cleaner when no tacky surface is present.

BRIEF DESCRIPTION OF THE DRAWINGS

Further advantages and features of this invention will become apparent upon consideration of the following description wherein.

DETAILED DESCRIPTION OF THE PREFERRED EMBODIMENTS

In practicing the invention, an element useful in an image reproduction process of the type disclosed in U.S. Pat. No. 3,649,268 issued to Victor F. H. Chu et al. may be selected. Such an element, following an imagewise exposure, will bear on its surface a latent image and will imagewise exhibit different degrees of tackiness. When particulate materials such as toner particles are sprinkled on such a surface, they tend to adhere to the tacky regions and develop a visible image. Such development is accomplished by a particular sequence of operations in feeding the element under the toner supply means, breaking up, depositing and distributing a uniform quantity of toner particles over the tacky areas of the element, cleaning off the excess toner particles and removing the treated element. Using the apparatus of the present invention results in a superior final developed image which is substantially free of streaks, exhibits excellent density uniformity and results in good reproducibility of imaging as measured in terms of density and density uniformity. Other known tacky surfaces may be used as desired.

Figure 1:
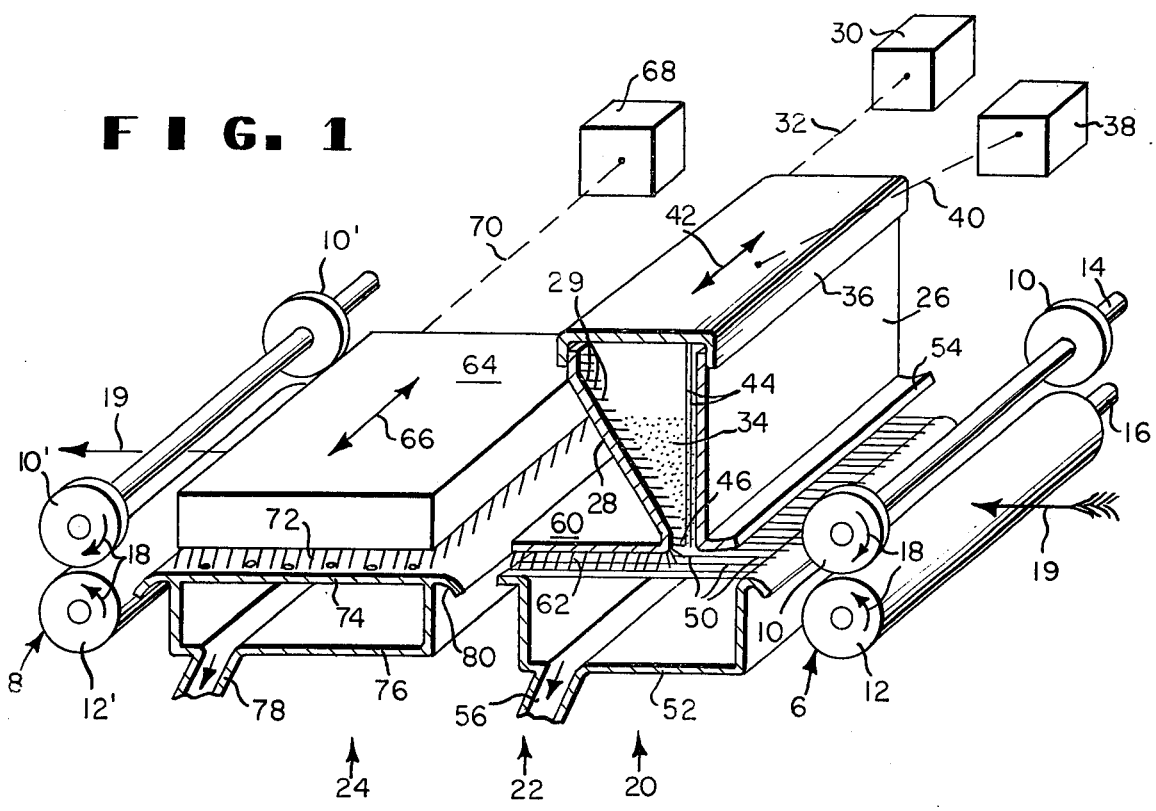
FIG. 1 is a pictorial representation of an automatic toning apparatus constructed in accordance with one embodiment of this invention.

There is seen in FIG. 1 an apparatus constructed in accordance with one embodiment of this invention. The apparatus includes a pair of entrance pull rolls 6 including a pair of upper edge rolls 10 mounted on a shaft 14 and a lower roll 12 mounted on a shaft 16. The distance between the edge rolls 10 may be adjustable to accommodate photosensitive elements (not shown in FIG. 1, but designated by the numeral 19 in FIG. 2) of varying widths. By the use of edge rolls, only the edges of the photosensitive element are gripped such that the soft tacky areas are not damaged. A complementary set of exit pull rolls 8 are positioned at the outlet end of the apparatus to pull the photosensitive element from the apparatus upon completion of the development operation. These exit pull rolls 10′, 12′ are designated by the same numerals as the entrance pull rolls, but for differentation are designated by the prime symbol(′). The entrance and exit pull rolls 6 and 8, respectively, may be independently driven by any suitable means such as by a chain belt, or other linkage such that the rolls are driven in synchronism in the directions indicated by the arrows 18. Alternatively the lower rolls 12, 12′ may be driven and the upper rolls 10, 10′ rotated by frictional contact of the material passing through the nip. In any event they operate to feed the photosensitive element through the apparatus in the sense or direction indicated by the arrows 19 (from right to left in the drawing).

The entrance rolls 6 pass the photosensitive element, horizontally disposed, into the first section 20 which is termed the dispenser section 20. The dispenser section is followed in sequence by an applicator section 22 and a cleaner section 24, as will be described, to complete the apparatus.

The dispenser section 20 comprises a hopper 26 having a movable side wall 28 which side wall is adapted to be vibrated or oscillated by a suitable drive means 30, acting through any suitable linkage depicted by the dashed line 32, in a horizontal plane and in a sense lateral of or transverse to the direction 19 in which the photosensitive element moves through the apparatus. As used herein, the term lateral means, in the preferred embodiment, 90° or about 90° but may be actually varied to as much as 90° plus or minus 10°. Actually greater deviations from the perpendicular than this may be employed but as the deviation increases there is a tendency for the particulate material in subsequent sections to become displaced to one side or the other depending upon the direction of angularity.

In similar manner, the hopper is provided with an inverted U-shaped cover 36 which also is freely movable relative to the hopper 26 in the lateral sense or direction depicted by the arrows 42 laterally of the movement of the photosensitive element through the apparatus. Suitable lubricating material, such as any of the known lubricating plastics, may be placed between the cover and the side walls of the hopper to facilitate this movement. The cover 36 is driven by a suitable drive means 38 acting through a linkage depicted by the dashed line 40. The linkages 32 and 40 and drive means 30 and 38 may be any suitable means such as electric motors operating through a crank arm, solenoid actuated vibrating members, etc.

A plurality of elongated pin-like elements 44, which preferably have a degree of flexibility, are attached to the cover 36 and extend downwardly into the toner 34 such that, as the cover oscillates, it aids in maintaining the particles in the fluid like, broken up condition and prevents their reaggregation. The elements 44 are essentially in a single line such that they extend down into the slit 46. Alternatively, the elements 44 may be suspended from or attached to a separate frame (FIG. 2) located below the cover. In this event the separate frame is driven by the linkage 40.

The particulate material may be any of the well known toner materials used for this purpose and is depicted at 34 in the hopper 26. In addition to the above noted functions, the lateral oscillation of the side wall 28 aid in uniformly distributing the toner across the width of the photosensitive elements by the movement of the moving side wall 28 relative to the other side wall of the hopper 26 which is fixed. To facilitate transmitting the mechanical motion of the movable side wall 28 to the particles 34, the side wall 28 is lined at 29 with any soft resilient, plushy, pad-like materials such as cotton, lambs wool, acrylic pile, mohair or for that matter, a soft bristle brush type material such as camel hair may be used. In a preferred embodiment of the invention, the side wall is mohair-lined. The walls of the hopper converge at the lower portion to form a narrow slit 46 transverse to the direction of movement of the photosensitive element.

A support typically in the form of parallel wires 50 is positioned under the exit slot 46 of the hopper 26 to provide a suitable support as the photosensitive element travels through the dispenser section 20. A receiving chamber 52, which may be generally U-shaped, is provided for collecting the excess toner particles as they fall from the entrance slot 46. It also provides a support means for the wires 50. The front edge of the chamber 52 together with the front edge 54 of the front wall of the hopper 26 define opening or flared lips to receive the photosensitive element and guide it into the dispenser section 20. Suitable vacuum may be applied to the chamber 52 through the orifice 56 for removing excess airborne toner particles.

The next section, the applicator section 22, may be formed integrally with the dispenser section 20 and may include an applicator 60 which may be in the form of a horizontally disposed plate integral with the movable side wall 28 with the lower surface of the applicator providing what is described as an agitating surface. Preferably the agitating surface may be mohair 62 although any of the materials disclosed previously for use in lining the side walls 28 of the hopper may also be used.

The cleaner section 24 is next and includes a horizontally disposed member 64 adapted to oscillate laterally, as depicted by the arrows 66, of the direction or sense of movement 19 of the photosensitive element through the apparatus. Such oscillatory motion is provided by a suitable drive means 68 operating through the mechanical linkage depicted by the dashed line 70 which may be similar to drive 30 and the linkage 32 previously described. The lower surface of the member 64 is an agitating surface which preferably may be surfaced with acrylic or mohair, although any of the materials previously described for use with the movable side wall 28 may be used in this instance also. The frequency of oscillation of the agitating surface 72 in the cleaner section may be equal to or greater than that of the movable side wall (or the applicator section 22) although, in a preferred embodiment of the invention, the cleaner section is oscillated at a slightly lower frequency. A support member for the photosensitive element is positioned directly under the horizontal member 64. This support member 74 may be a perforated plate or, in a preferred embodiment, may be an expanded metal plate. Such expanded metal plate has diamond-shaped orifices or slots therein which form a relatively abrupt edge.

In the absence of a photosensitive element, the agitating surface 72 contacts the support surface 74 and the perforations therein aid in removing any remaining particulate material therefrom such that it may drop into a collecting chamber 76 formed below the support plate 74 to collect excess toner particles. To this end a vacuum means may be provided for removing airborne particles through an orifice 78. The front edge 80 of the support surface 74 may be bent downwardly to facilitate the feeding of the photosensitive element through the cleaner section 24.

Figure 2:
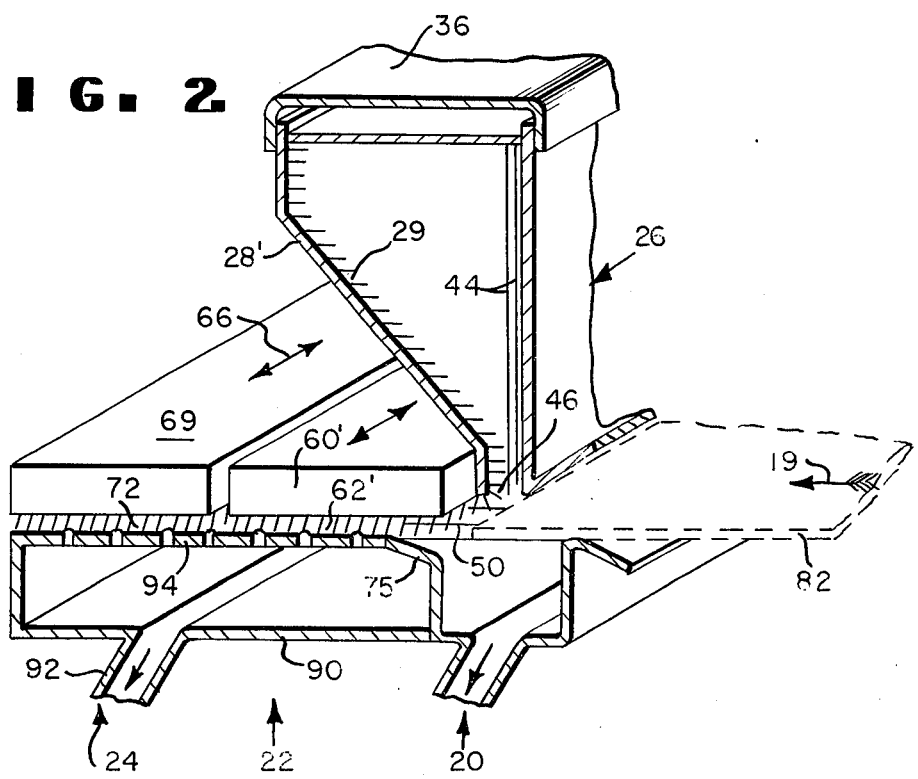
FIG. 2 is a partial pictorial representation of an automatic toning device constructed in accordance with another enbodiment of this invention; and, FIG. 3 is a partial pictorial representation of an automatic toning device constructed in accordance with still another embodiment of this invention.

In operation, a photosensitive element 82, such as may be seen most clearly in FIG. 2, is fed to the entrance pull rollers 6 in the direction depicted by the arrow 19. These rollers grip the photosensitive element at its side edges and move it into the entrance slot of the dispenser section 20. As the photosensitive element moves beneath the exit slot 46 of the hopper 26, it receives the particulate material thereon in a relatively uniform manner. Passing on to the applicator section 22, it is subjected to the lateral motion of the agitating surface 62 which tends to apply a shear force. This shear force embeds the particles in the tacky surfaces and redistributes excess particles from the non-tacky regions into the tacky regions. Any excess particles, after the photosensitive element 82 leaves this region, are permitted to easily pass through the support wires 50, and are collected in the chamber 52. In this connection, it should be noted that the support wires in many applications may be omitted. This facilitates in the cleaning of the apparatus.

Upon leaving the applicator section 22, the photosensitive element is passed on to the cleaner section 24 still being driven by the entrance rolls 6. As it reaches the cleaner section 24, it is subjected to the lateral motion of the agitating surface 72 such that any remaining loose particles are removed entirely from the non-tacky regions thereof after which the element is passed on to the exit rolls 8, as depicted by the arrows 19, passed on to be stacked or otherwise retrieved by the operator. Once the cleaner section 24 is free of the photosensitive element, continued oscillatory movement of the agitating surface 72 against the perforated support plate 74 tends to remove any of the particles adhered to such surface and allow them to fall into the chamber 76. This cleaning mechanism greatly facilitates the usage of the apparatus with different colored toner particles.

Another form of the invention is shown in FIG. 2 in which the applicator section 22 is formed independently of the movable side wall, designated 28', of the hopper 26. This leaves an independently movable applicator plate 60' and agitating surface 62'. Also, the pin like elements 44 are attached to a laterally movable plate 45 driven by the drive means 38 (FIG. 1) through the linkage 40 (FIG. 1). This permits the cover to remain stationary. Otherwise it construction and movement are substantially identical. In this instance a common chamber 90 having a vacuum attachment 92 is proved to receive any excess toner from either the applicator section 22 or the cleaner section 24. A common perforated support plate 94, which may be the same as the perforated plate 74 described previously, may be used for both the applicator and cleaner sections. This has the advantage in that excess particles are more readily removed from the applicator plate 60'; otherwise, the operation remains the same except that the plate 94 has its front portion 75 sloped down. This provides a larger entrance opening for the element 82 and, more importantly, subjects a portion of the pad 62' to an increasing pressure gradient as the element 82 moves through the apparatus. In this manner the pad 62' with toner is subjected to a gradually increasing pressure gradient. This has the advantage in that particulate materials require consistent pressures to be uniformly affixed to the tacky surface. Hence regardless of the pressure required it is always supplied at some point in the gradient throughout the full width of the pad 62'. Too much pressure is not harmful as long as it does not stall the element 82. Another advantage provided by this sloped entrance is that it does not contact the leading portion of the pad 62' leaving an uncleaned area at the entrance. This acts as a toner reservoir—the toner is packed in the bristles—for subsequent elements 82. Without such arrangement the leading edge of an element often can be toner "starved." The sloped entrance thus permits a more uniform toner application.

Figure 3:
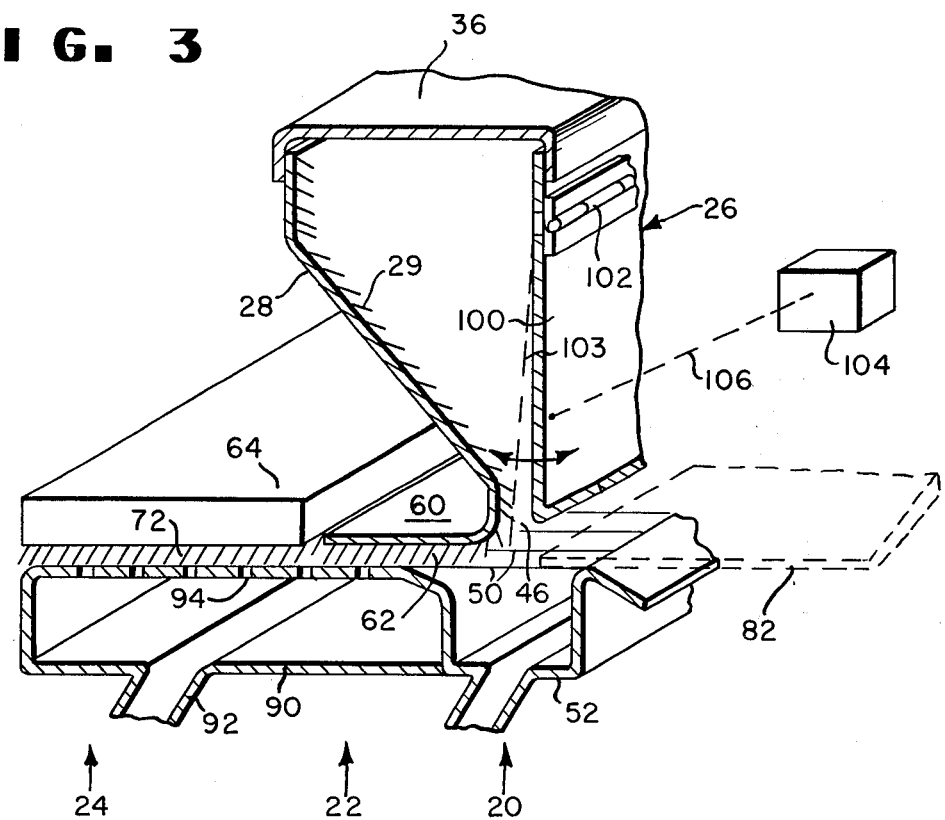

Still another alternative embodiment of the invention depicted in FIG. 1 is shown in FIG. 3. In this embodiment, as in FIG. 2, a common chamber 90 is used for both the applicator and cleaner sections 22 and 24, respectively. Thus the perforated support 94 underlies the cleaner plate 64 as well as the applicator plate 60, the latter being integral with the movable side wall 28 as depicted in an embodiment of FIG. 1. Another change in this embodiment is that the front wall 100 of the hopper 26 is hinged as at 102. The hinged portion is actuated by a solenoid or other two position device 104 acting through a suitable linkage 106 to open or close (103) the entrance slot 46 of the hopper. This provides a more positive action; i.e., opening and closing of the exit slot, which may be desirable in many applications. Alternatively, a multiposition actuator 104 may be used to permit the slot to acquire different opening degrees further to accommodate it to various particulate material.

There has thus been described an improved apparatus for developing images, particularly those formed on tacky surfaces. The development mechanism is simple, easily cleaned, permits uniform application of the particulate material to the surface, embeds the material in the surface and finally, cleans the material all automatically. The mechanism by which these operations are performed relies upon oscillating the various elements at varying frequencies transversely to the direction of motion of the photosensitive elements to accommodate this purpose.

I claim:

1. In apparatus for uniformly developing an image defining tacky surface with particulate material, said apparatus having a dispenser for dispensing said particulate material above said surface, an applicator for embedding said particulate matter in said surface, a cleaner for removing excess particulate matter from said surface, and means for moving said tacky surface in a first sense past said dispenser, said applicator, and said cleaner, the improvement wherein:

said dispenser includes a hopper having an independently movable side wall, and first means to oscillate said side wall laterally of said first sense, thereby to supply said particulate material to said surface at a uniform, controlled rate.

2. Apparatus according to claim 1 wherein said sidewall has means disposed thereon for imparting motion to said particulate matter.

3. Apparatus according to claim 2 wherein said imparting means is a resilient plushy material.

4. Apparatus according to claim 2 wherein said hopper has a cover which is independently movable laterally of said first sense, said cover having elongated members extending downwardly into said hopper, and second means to oscillate said cover out of phase with said sidewall.

5. Apparatus according to claim 4 wherein said applicator comprises a horizontally disposed agitating surface, and means for oscillating said agitating surface laterally of said first sense.

6. Apparatus according to claim 5 wherein said applicator agitating surface is oscillated at a frequency different than that of said sidewall.

7. In apparatus according to claim 6 wherein said applicator agitating surface oscillation frequency is lower than said sidewall oscillation frequency.

8. In apparatus according to claim 5 wherein said means for moving said tacky surface includes a stationary perforated support under said applicator agitating surface, thereby to aid in cleaning said applicator agitating surface adjacent said tacky surface.

9. In apparatus according to claim 5 wherein said cleaner comprises a horizontally disposed agitating surface, and means for oscillating said surface laterally of said first sense.

10. In apparatus according to claim 9 wherein said means for moving said tacky surface includes a stationary perforated support under said cleaner agitating surface, thereby to aid in cleaning said cleaner agitating surface adjacent said tacky surface.

11. In apparatus according to claim 10 which includes vacuum means under said perforated supports for removing said particulate matter that is airborne.

12. In apparatus according to claim 1 wherein said hopper has elongated members extending downwardly into said hopper, and second means to oscillate said members laterally of said first sense out of phase with said sidewall.

13. In apparatus according to claim 1 wherein said applicator comprises a horizontally disposed agitating surface, and means for oscillating said applicator agitating surface laterally of said first sense.

14. In apparatus according to claim 1 wherein said cleaner comprises a horizontally disposed agitating surface, and means for oscillating said cleaner agitating surface laterally of said first sense.

15. In apparatus for uniformly developing an image defining tacky surface with particulate material adherent to said surface, said apparatus having a dispenser for dispensing said particulate material above said surface, an applicator for embedding said particulate material in said surface, a cleaner for removing excess particulate material from said surface, and means for moving said tacky surface in a first sense past said dispenser, said applicator, and said cleaner, the improvement wherein:

said applicator comprises a horizontally disposed agitating surface, and means for oscillating said applicator agitating surface laterally of said first sense.

16. In apparatus according to claim 15 wherein said means for moving said tacky surface includes a stationary, perforated support under said applicator agitating surface, thereby to aid in cleaning said applicator agitating surface in the absence of said tacky surface.

17. In apparatus according to claim 16 wherein said cleaner comprises a horizontally disposed agitating surface, and means for oscillating said cleaner agitating surface, thereby to aid in cleaning said cleaner agitating surface.

18. In apparatus according to claim 17 wherein said means for moving said tacky surface includes a stationary perforated support under said cleaner agitating surface, thereby to aid in cleaning said agitating surface in the absence of said tacky surface.

19. In apparatus according to claim 16 wherein the entrance portion of said perforated support under said applicator is sloped downwardly.

20. In apparatus according to claim 15 wherein said dispenser includes a hopper having elongated members extending into said hopper, and second means for oscillating said members laterally of said first sense.

* * * * *